(12) United States Patent
Ito

(10) Patent No.: US 6,436,790 B2
(45) Date of Patent: Aug. 20, 2002

(54) METHOD FOR FABRICATION SEMICONDUCTOR DEVICE HAVING TRENCH ISOLATION STRUCTURE

(75) Inventor: Shinya Ito, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/845,306

(22) Filed: May 1, 2001

(30) Foreign Application Priority Data

May 10, 2000 (JP) ........................................ 2000-136566

(51) Int. Cl.⁷ .............................................. H01L 21/76
(52) U.S. Cl. ........................................ 438/424; 438/435
(58) Field of Search ................................. 438/424, 435

(56) References Cited

U.S. PATENT DOCUMENTS

| 5,976,947 | A | * | 11/1999 | Reinberg ..................... 438/424 |
| 6,033,970 | A | * | 3/2000 | Park ........................... 438/435 |
| 6,093,611 | A | * | 7/2000 | Gardner et al. ............. 438/295 |
| 6,140,208 | A | * | 10/2000 | Agahi et al. ................ 438/435 |
| 6,143,625 | A | * | 11/2000 | Chen et al. ................. 438/435 |
| 6,180,467 | B1 | * | 1/2001 | Wu et al. .................... 438/435 |
| 6,228,742 | B1 | * | 5/2001 | Yew et al. ................... 438/435 |
| 6,255,176 | B1 | * | 7/2001 | Kim et al. ................... 438/435 |
| 6,265,281 | B1 | * | 7/2001 | Reinberg ..................... 438/400 |
| 2002/0004281 | A1 | * | 1/2002 | Lee et al. .................... 438/424 |

FOREIGN PATENT DOCUMENTS

| EP | 000423722 A2 | * | 4/1991 | ......... H01L/21/76 |
| JP | 1-281746 | | 11/1989 | |
| JP | 5-304205 | | 11/1993 | |
| JP | 9-260484 | | 10/1997 | |
| JP | 11-176924 | | 7/1999 | |

OTHER PUBLICATIONS

Scott et al., "NMOS Drive Current Reduction Caused by Transistor Layout and Trench Isolation Induced Stress", pp. 827–830, IEEE., 1999.

Nag et al., "Comparative Evaluation of Gap–Fill Dielectrics in Shallow Trench Isolation for Sub–0.25 um Technologies", pp. 841–844, IEEE, 1996.

* cited by examiner

Primary Examiner—Olik Chaudhuri
Assistant Examiner—David S. Blum
(74) Attorney, Agent, or Firm—McGinn & Gibb, PLLC

(57) ABSTRACT

A method for fabricating a semiconductor device is provided in which a stress applied to each element formation region from each trench isolation region is sufficiently suppressed. The method is featured in that an insulating layer, which is to fill a trench selectively provided in a semiconductor substrate, is formed through at least two, separate deposition steps, and a heat treatment is performed after each deposition step. That is, first, a trench is formed on the silicon substrate and a insulating film is deposited in the trench on condition that the insulating film does not fully bury the trench. Then, a heat treatment is conducted. Finally, an insulating film is deposited in the trench to fully bury the trench, and subsequently the heat treatment is conducted.

8 Claims, 4 Drawing Sheets

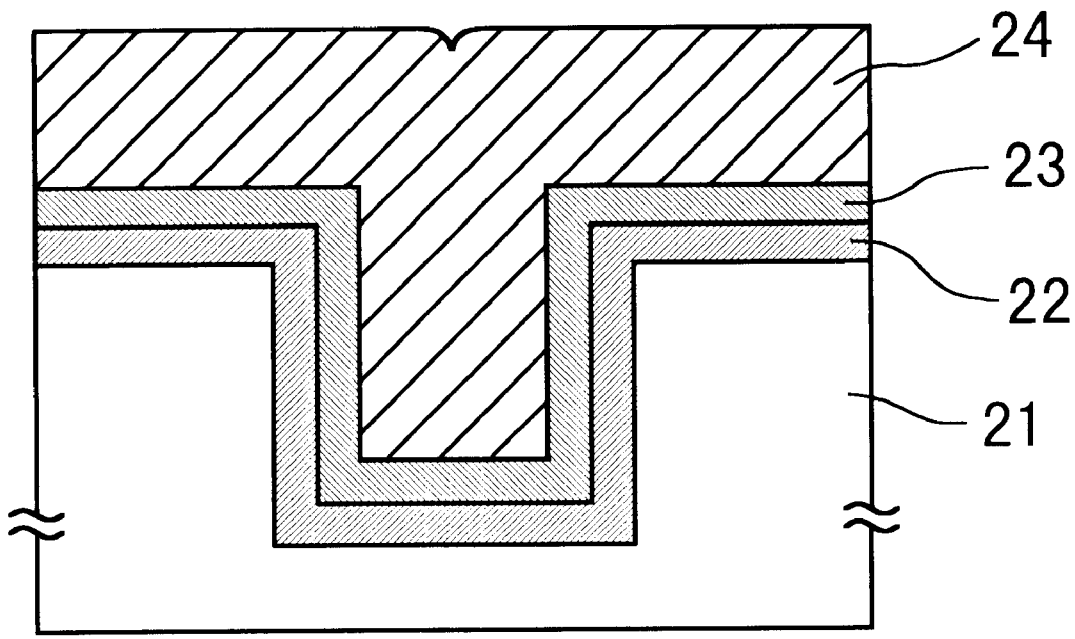
Fig. 2A  *Prior Art*
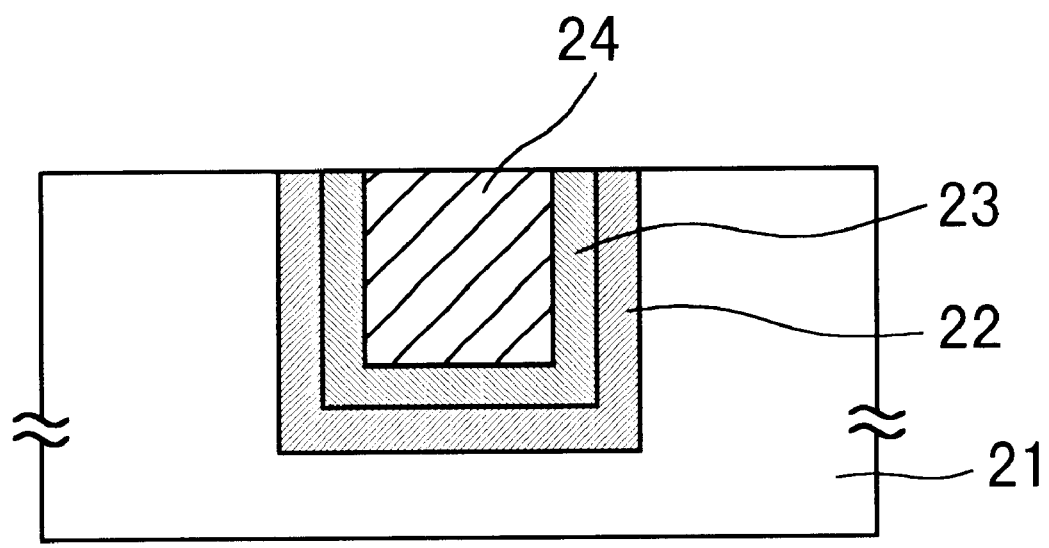
Fig. 2B  *Prior Art*

METHOD FOR FABRICATION SEMICONDUCTOR DEVICE HAVING TRENCH ISOLATION STRUCTURE

BACKGROUND OF THE INVENTION

1. Field of the Invention

The present invention relates to a method for fabricating a semiconductor device, in particular to a method for fabricating a semiconductor device in which circuit elements such as transistors are electrically isolated from each other by trench isolation regions.

2. Description of the Related Art

In a semiconductor device in which a large number of circuit elements are formed on a semiconductor substrate, it is required to electrically isolate element formation regions in which the elements are to be formed from each other. A trench isolation structure is widely used as such isolation means, because the trench isolation region itself can be extremely small in area. In this structure, a trench is formed in portions of the semiconductor substrate that are allocated for isolation regions, and then buried with an insulating film.

It was, however, reported by the IEEE IEDM (International Electron Device Meeting) Technical Digest (1999, pp. 827–830) that a stress applied from the trench isolation regions to the element formation regions deteriorates the electric characteristics of the elements formed therein. One of the major origins of such stress is due to an expansion or shrinkage of the insulating film filling the trench, that is caused by later thermal treatments such as a heat treatment for an improvement in a quality of the insulating film filling the trench (called hereinafter "trench insulating film"), a thermal oxidation for forming a gate oxide film and so on, and an annealing treatment for activating ion-implanted impurities.

There have been proposed two countermeasure methods for suppressing such stress. The first one is to attempt not to transmit the stress due to the expansion and/or shrinkage of the trench insulating film to the element formation region. The second one is to attempt to reduce the expansion and/or shrinkage of the trench insulating film itself.

The first method is such that a stress buffer layer is formed between the trench insulating film and the element formation region, and is disclosed, for example, in Japanese Laid-open (Kokai) Patent Publication Hei 11-176924 or Hei 1-281746. Taking the 11-176924 Publication as an example, this method will be explained with reference to FIGS. 1A–1D.

As shown in FIG. 1A, a pad oxide film 12 and a pad nitride film 13 are formed on a silicon substrate 11 and a trench pattern is formed therein by use of photolithography techniques and etching techniques. The pad oxide film 12 is generally formed by thermal oxidation to relax a stress between the silicon substrate 11 and the pad nitride film 13.

Next, as shown in FIG. 1B, using a pad nitride film pattern as a mask, the silicon substrate 11 is etched to form a trench T. Subsequently, in order to recover crystal defects of the substrate 11 around the trench T, which are generated during etching, a thermal oxide film 14 is formed on the side walls and the bottom of the trench T. Then, in accordance with the first method, a silicon nitride film 15 is deposited as a buffer layer for the purpose of absorbing the stress given by the trench insulating film that will be formed in a subsequent step.

After that, as shown in FIG. 1C, the inside of the trench T is buried with a high density plasma CVD oxide film 16, followed by performing the CMP (Chemical Mechanical Polishing) to leave the high density plasma CVD oxide film in the trench T.

Subsequently, as shown in FIG. 1D, the pad nitride film 13 and the pad oxide film 12 are removed by wet etching to expose active regions. After that, it will be continued to a transistor device forming process.

On the other hand, the second method is to fill the trench with a plurality of insulating films that are different in composition ratio of film materials from each layer. This method is disclosed, for example, in Japanese Laid-open (Kokai) Patent Publication Hei 5-304205 or 9-260484, and will be explained referring to FIG. 2A and FIG. 2B. These figures are entered in the Hei 5-304205 Publication.

As shown in FIG. 2A, a trench pattern is formed in a silicon substrate 21 and a thermal oxide layer 22 is formed on the side walls and the bottom of the trench. Then, a first silicon nitride layer 23 which is silicon-rich and has relatively less stress and higher conductivity is deposited on the oxide layer. Subsequently, a second silicon nitride layer 24 which has a nearly stoichiometric composition ratio and has relatively larger stress and lower conductivity is fully buried in the trench. Then, as shown in FIG. 2B, all film layers except in the trench are removed using the CMP technique and a wet etching technique to expose active regions. The layers 23 and 24 may expand or shrink in opposite direction to each other.

The present inventor has, however, recognized that there are significant problems with both of the above methods. That is, in the first method, as shown in FIG. 1D, the volume of the high density plasma CVD oxide film 16 as an insulating film inside the trench T is much larger than that of the buffer layer 15. For this reason, the buffer effect is not sufficient to maintain desired electrical characteristics of the elements. In particular, the high density plasma oxide film, that is suitable to fill without void such a fine or narrow trench as having sub-micron width for realizing the high integration and fine patterns, presents a large compressive stress. Therefore, the thin buffer layer does not have a sufficient buffer effect. If the buffer layer is formed thick, such thick layer no longer serves as a buffer layer. Rather, it constitutes apart of the trench insulating film.

It is to be noted that since the high density plasma insulation layer is formed by a high density plasma CVD method in which deposition and sputter etching occurs mutually, the high density plasma insulation layer is clearly distinguished from an ordinary plasma CVD insulating film in aspect of deposition process/mechanism. The high density plasma CVD insulating film can completely fill or bury a trench having a width of 0.5 $\mu$m or less without void. On the other hand, the trench employing the ordinary plasma CVD insulating film as the trench insulating film is almost always accompanied with a void. Characteristics of the high density plasma CVD insulating film and the differences thereof from the ordinary plasma CVD insulating film are described in the IEEE IEDM Technical Digest (1996, pp. 841–844).

In the second method, it is difficult to control the composition ratio of film materials in each layer to a desired value. The reproducibility is thus poor in this method. Furthermore, this method uses an insulating film other than a high density plasma CVD method is employed, the trench insulating film can not bury a trench having a width of 0.5 $\mu$m or less without generation of any void.

SUMMARY OF THE INVENTION

Therefore, an object of the present invention is to provide an improved method of fabricating a semiconductor device having a trench isolation structure.

Another object of the present invention is to provide a method of fabricating a semiconductor device in which the stress applied to each element formation region from each trench isolation region is efficiently suppressed.

Still another object of the present invention is to provide a method of fabricating a semiconductor device having a trench isolation structure wherein a trench with a sub-micron width of 0.5 µm or less is filled with an insulating film without generation of a void in the trench and with suppressing stress to an element formation region surrounded by the trench.

Yet another object of the present invention is to provide method of fabricating a semiconductor device having a trench isolation structure with controllability and reproducibility.

A method according to the present invention is featured in that an insulating layer, which is to fill a trench selectively provided in a semiconductor substrate, is formed through at least two, separate deposition steps, and a heat treatment is performed after the first deposition step and before the second deposition step.

In other words, the trench insulating layer is not formed at single deposition step, but is performed at least two, separate deposition steps with the heat treatments conducted between these deposition steps. As a matter of course, the insulating film deposited through the first deposition step does not completely fill the trench, leaving a space in the trench, and under this condition, the heat treatment is carried out. By this heat treatment, the trench insulating film formed through the first deposition shrinks or expands. However, in this case, the insulating film is physically free on the side of surface which is exposed to the space in the trench. Accordingly, there is a degree of freedom in the rearrangement of atoms in the insulating film, and the application of the stress due to the expansion or shrinkage of the trench insulating film to the element formation region can be effectively prevented. It is further to be noted that the trench insulating film falls essentially in a thermally stable state after the expansion or shrinkage during the heat treatment. Therefore, even if later thermal treatments such as a thermal oxidation process for forming a gate oxide film and so on and an annealing treatment for activating ion-implanted impurities are carried out, re-expansion or re-shrinkage of the trench insulating film does not substantially occur.

Thus, the method according to the present invention is to make a part or a great part of the trench insulating layer thermally stabilized prior to the trench being completely filled with an insulating film. As a result, the stress applied to each element formation region from each trench isolation region is efficiently suppressed during a further thermal treatment.

With respect to the trench insulating film that has been formed through the final deposition, it may generate some stress during the heat treatment applied thereto because there is no such space as described above. However, such stress can be confined within the level not to cause the substantive deterioration of the characteristics of elements, because the volume of the insulating film deposited at the last deposition step is relatively small.

It is convenient to use a high density plasma CVD insulating film, particularly a high density plasma CVD silicon oxide film, as an insulating film that is to fill the trench. Thus, at least two times of deposition of a high-density plasma silicon oxide film are carried out with performing a heat treatment after each deposition. As a result, the trench with a sub-micron width such as 0.5 µm or less is filled completely with the high-density plasma silicon oxide film without generation of any void in the trench and with substantive suppression of stress applied to the element formation region.

BRIEF DESCRIPTION OF THE DRAWINGS

The above and other objects, advantages and features of the present invention will be readily understood by considering the following description in conjunction with the accompanying drawings, in which:

FIGS. 2A–2B are cross-sectional views illustrating the steps of the method for fabricating a semiconductor device according to another prior art;

DESCRIPTION OF THE PREFERRED EMBODIMENTS

Description will now proceed to embodiments of the invention.

Figure 1A:
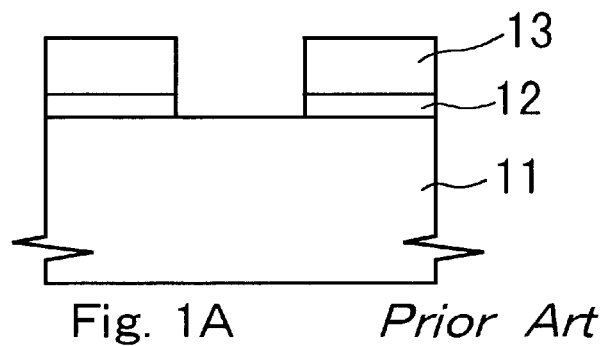
FIGS. 1A–1D are cross-sectional views illustrating the steps of the method for fabricating a semiconductor device according to one prior art.
Figure 1B:
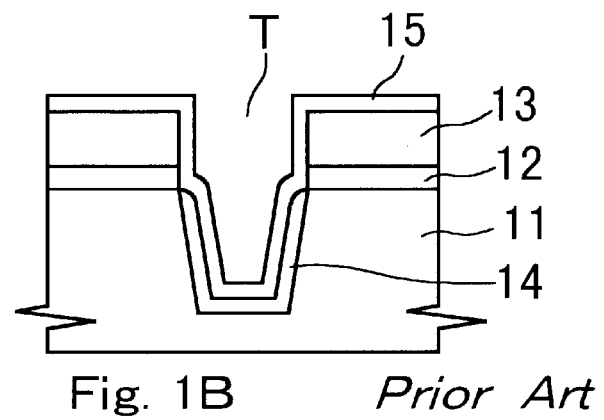
Figure 1C:
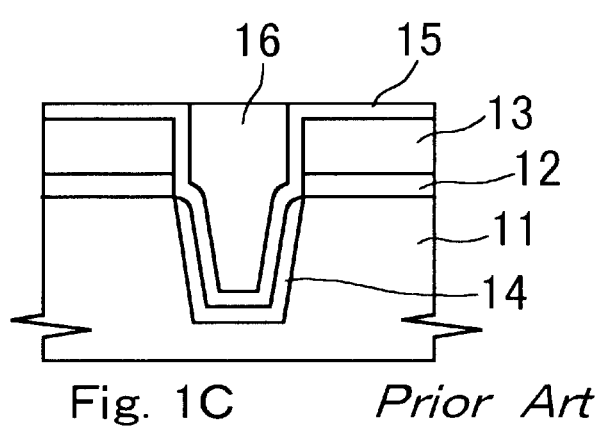
Figure 1D:
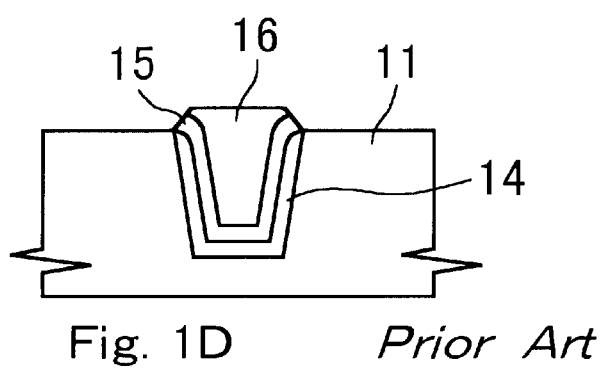
Figure 3A:
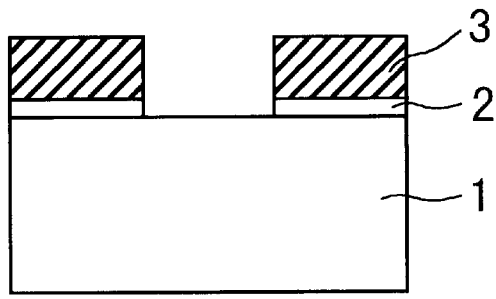
FIGS. 3A–3F are cross-sectional views illustrating the steps of the method for fabricating a semiconductor device according to a first embodiment of the present invention.

As shown in FIG. 3A, according to the first embodiment of the present invention, a pad oxide film 2 having a thickness of 10 nm and a pad nitride film 3 having a thickness of 0.2 µm are sequentially formed on a silicon substrate 1 and are patterned using usual lithography techniques and etching techniques, to expose those portions of the semiconductor substrate 1 where trench isolation regions are to be subsequently formed. The width of the exposed portions, in other words, trenches is designed to be 0.4 µm in the present embodiment.

Figure 3D:
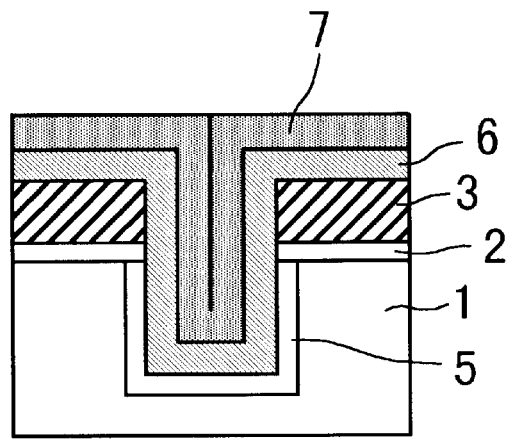
Figure 3B:
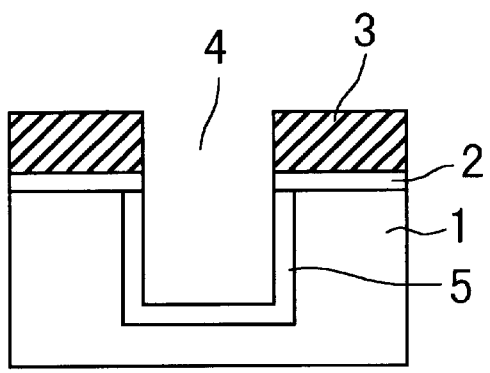

Then, as shown in FIG. 3B, using the pad oxide film 2 and/or the pad nitride film 3 as a mask, the silicon substrate 1 is etched by a depth of 0.4 µm to form a trench 4, whose width and depth are equal together. After that, the thermal oxidation is performed to a thermal oxide film 5 having a film thickness of 10 nm on substrate 1 defining the side walls and the bottom of the trench. The purpose of this thermal oxidation to recover crystal defects of the substrate 1, that have been generated during the trench etching.

Figure 3E:
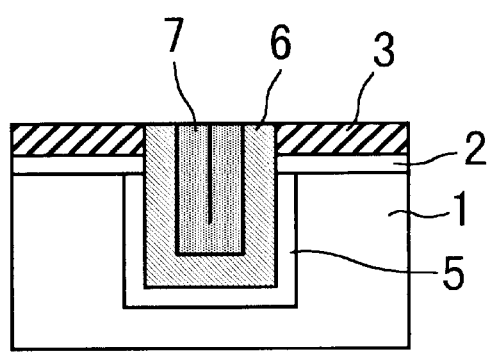
Figure 3C:
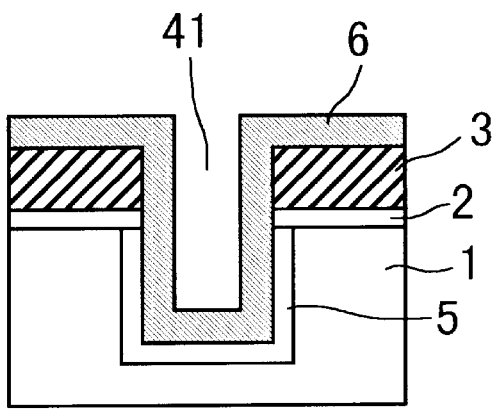

Then, as shown in FIG. 3C, a first high density plasma CVD oxide film 6 is deposited using the high-density plasma CVD method. In accordance with the present invention, however, the film thickness of the oxide film 6 is set so as not to fully bury the trench. In this embodiment, the oxide film 6 is deposited to have a thickness of 0.1 µm. Therefore, the trench 4 is filled by the oxide film 6 by 0.2 µm in its width direction, thereby leaving some gap or space 41 in the trench 4, as shown in FIG. 3C.

Subsequently, a heat treatment is conducted according further to the present invention. In this embodiment, this heat treatment is performed in an atmosphere of an inert gas such as nitrogen at 800° C. for 10 minutes. During this heat treatment, the expansion of the high density plasma oxide film 6 occurs and then moves into a thermally stable state. The space 41 in the trench 4 releases the silicon substrate 1 from the stress due to the expansion of the film 6.

Next, as shown in FIG. 3D, a second high density plasma CVD deposition is carried out to form an oxide film 7 over the entire surface of the wafer including the space 41 of the trench 4. This film 7 is deposited with thickness of 0.1 µm. Thus, the trench 41 is completely filled with high density plasma CVD oxide films 6 and 7 without any void in the trench 4.

A heat treatment is conducted in an atmosphere of an inert gas such as nitrogen at 800 C for 10 minutes to bring the oxide film 7 into a thermally stable state. At this time, there is no longer any substantial space in the trench 4. For this reason, the expansion of the oxide film 7 intends to give some stress to the silicon substrate 1. However, the oxide film 6, which has been already brought into the thermally stable state, exists between the oxide film 7 and the substrate 1. Therefore, the stress from the oxide film 7 to the substrate 1 is suppressed to such a level that dose not affect substantial changes in electrical characteristics of transistors which will be later formed in the elements formation regions or active regions surrounded by the trench 4.

Then, as shown in FIG. 3E, for the surface planerization, the first and second high density plasma oxide films 6 and 7 other than in the trench are removed by the CMP method, which process is terminated at the time when the pad nitride film 3 has been exposed.

Figure 3F:
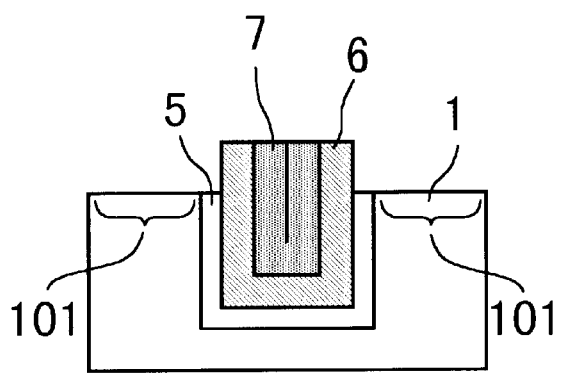

Next, as shown in FIG. 3F, the pad nitride film 3 and the pad oxide film 2 are removed by wet etching to expose active regions or element formation regions 101. After that, the remaining steps are executed to form circuit elements such as transistors and electrical conductive layers (wiring) in and/or on the element formation regions 101. While such steps include thermal treatments such as a thermal oxidation or an annealing process, the stress from the trench insulating films 6 and 7 to the substrate 1 hardly occurs, because both of the films 6 and 7 are in the thermally stable state.

As described above, the trench insulating layer is not formed by a single deposition step, but is formed by two, separate deposition steps as indicated by two high density plasma CVD oxide films 6 and 7 with the heat treatment before the deposition of the second oxide film 7. Accordingly, the expansion of the high density plasma CVD oxide film 6 occurs under the existence of the space 41, and the expansion of the high density plasma CVD oxide film 7 occurs under the existence of the thermally stabilized film 6. In addition, the thermal treatments during the transistor formation stops are performed under the existence of the thermally stabilized films 6 and 7. Therefore, the stress applied to each element formation region of the silicon substrate 1 is efficiently suppressed to such a level that does not deteriorate transistor characteristics.

The stress suppression effects are enhanced by forming the trench insulation layer with three or more deposition steps. In this case, the manufacturing steps are prolonged to lower the process throughput. Accordingly, it convenient to form the trench insulating layer by two or three depositions. In other words, the film thickness of the high density plasma oxide film at each deposition for the trench insulation layer is appropriate to be ⅙ to ¼ of a trench width. The heat treatment performed on each high density plasma oxide film is to bring it into the thermally stable state. The temperature range from 700° C. to 1000° C. is preferable for such purpose.

It is to be noted that the heat treatment to the uppermost layer of the high density plasma CVD oxide film may be done after the surface planerization. That is, the heat treatment for the oxide film 7 can be done after the CMP at the stage of FIG. 3E.

Next, a second embodiment of the invention will be described referring to FIG. 4.

In the first embodiment set forth, the method was conducted in which the trench was fully buried with the high density plasma oxide film and then CMP was performed. If a high density plasma oxide film has an extremely huge difference of a coefficient of thermal expansion to the silicon substrate, it is possible that crystal defects may be generated in the silicon substrate near the trench when the heat treatment is conducted under the conditions that the oxide film resides on the entire surface of the silicon substrate. This embodiment will exhibit the way to avoid this problem.

Figure 4A:
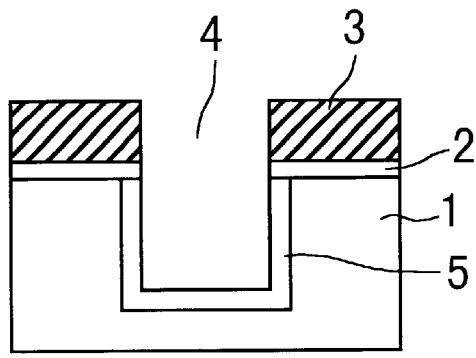
FIGS. 4A–4F are cross-sectional views illustrating the steps of the method for fabricating a semiconductor device according to a second embodiment of the present invention.

First, as shown in FIG. 4A, a pad oxide film 2 and a pad nitride film 3 are sequentially formed on a silicon substrate 1, a trench pattern is formed thereon and then a trench 4 having a width of 0.4 µm and a depth of 0.4 µm is formed in the silicon substrate.

Figure 4D:
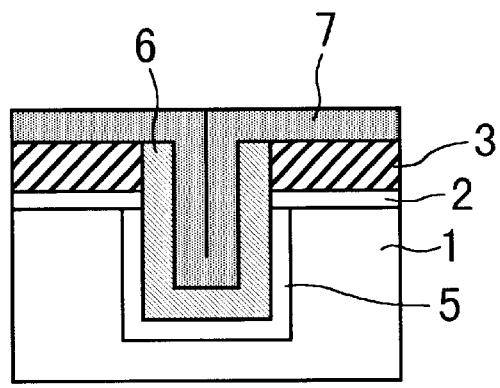
Figure 4B:
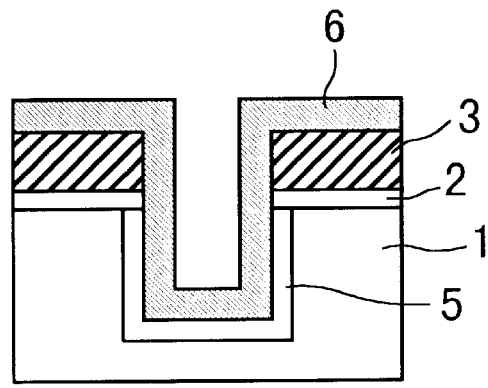

Then, as shown in FIG. 4B, a first high density plasma oxide film 6 is deposited to have a film thickness of 0.1 µm.

Figure 4E:
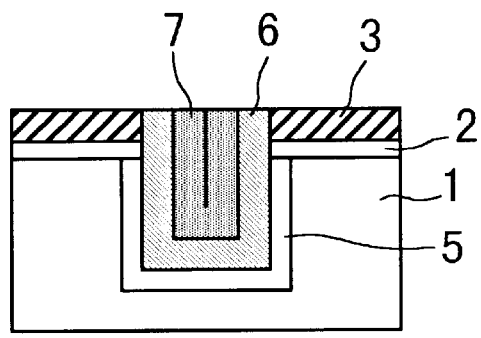
Figure 4C:
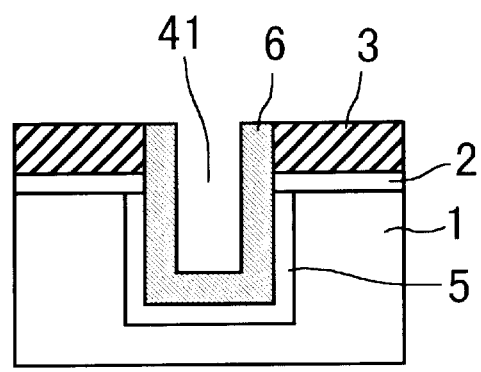

Subsequently, as shown in FIG. 4C, the first high density plasma CVD oxide film 6 on the pad nitride film 3 is removed by CMP, and thereafter a heat treatment is performed in a nitrogen atmosphere at 700° C. to 1000° C. for 10 minutes.

Next, as shown in FIG. 4D, a second high density plasma CVD oxide film 7 is further deposited to have a film thickness of 0.1 µm to fully bury the trench.

Then, as shown in FIG. 4E, CMP is conducted to remove the second high density plasma oxide film 7 except in the trench. After that, the heat treatment is performed in the nitrogen atmosphere at 700° C. to 1000° C. for 10 minutes.

Figure 4F:
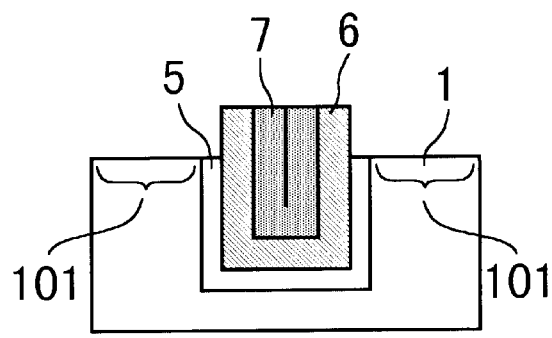

Subsequently, as shown in FIG. 4F, the pad nitride film 3 and the pad oxide film 2 are removed by wet etching.

In the method according to the embodiment, in each deposition step a high density plasma CVD oxide film is deposited inside the trench 4, the high density plasma oxide film on the pad nitride film is removed and then a heat treatment is performed. Therefore, even though there exits an extremely huge difference of a rate of thermal shrinkage or coefficient of thermal expansion between the high density plasma oxide film and the silicon substrate 1, the stress can be relaxed without generating any crystal defects in the silicon substrate.

Furthermore, the silicon nitride film 3 is used as a stopper of CMP so that CMP can be terminated at a predetermined position.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of fabricating a semiconductor device comprising:
   performing a selective etching to form a trench in a semiconductor substrate by using first insulating film formed on said semiconductor substrate as a mask, said trench having a first width;
   performing a first deposition to form a first high-density plasma insulating film in said trench, over said first insulating film, said first high-density plasma insulating film having a second width that is smaller than said first width to thereby leave a space in said trench;
   performing a first heat treatment on said first high-density plasma insulating film after a portion of said first high-density plasma insulating film formed over said first insulating film is removed;

performing a second deposition to form a second high-density plasma insulating film in said space; and performing a second heat treatment on said high-density plasma insulating film.

2. The method as claimed in claim 1, wherein said portion of said first high-density plasma insulating film is removed by a chemical-mechanical polishing.

3. The method as claimed in claim 1, wherein said second high-density plasma insulating film is further formed over said first insulating film by said second deposition, said second heat treatment is performed after a part of said second high-density plasma insulating film formed over said first insulating film is removed.

4. The method as claimed in claim 3, wherein said part of said second high-density plasma insulating film is removed by a chemical-mechanical polishing method.

5. The method as claimed in claim 4, wherein said etching is performed by a chemical-mechanical polishing until said first insulation film is exposed.

6. The method as claimed in claim 1, wherein each of said first and second heat treatments is performed at an atmosphere of an inert gas.

7. The method as claimed in claim 6, wherein each of said first and second heat treatments is performed at a temperature of 700 to 1000° C.

8. A method of fabricating a semiconductor device comprising:

performing a selective etching to form a trench in a semiconductor substrate by using a first insulating film formed on said semiconductor substrate as a mask, said trench having a first width;

performing a first deposition to form a first high-density plasma insulating film in said trench, said first high-density plasma insulating film having a second width that is smaller than said first width to thereby leave a space in said trench;

performing a first heat treatment on said first high-density plasma insulating film;

performing a second deposition to form a second high-density plasma insulating film in said space;

etching said first and second high-density plasma insulating films over said first insulating film while leaving portions of said first and second high-density plasma insulating films filling said trench; and performing a second heat treatment on said second high-density plasma insulating film after said first and second high-density plasma insulating films over said first insulating film are etched.

* * * * *